(12) United States Patent
Kim et al.

(10) Patent No.: US 7,973,474 B2
(45) Date of Patent: Jul. 5, 2011

(54) ELECTROLUMINESCENT DISPLAY INCLUDING CONDUCTIVE FILM COUPLED TO CONNECTOR

(75) Inventors: Mihae Kim, Yongin-si (KR); Woongsik Choi, Yongin-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 275 days.

(21) Appl. No.: 11/902,569

(22) Filed: Sep. 24, 2007

(65) Prior Publication Data

US 2008/0169750 A1     Jul. 17, 2008

(30) Foreign Application Priority Data

Jan. 15, 2007   (KR) .......................... 10-2007-004438

(51) Int. Cl.
*H01J 1/62* (2006.01)
*H01J 63/04* (2006.01)

(52) U.S. Cl. .................. 313/512; 313/498; 313/506
(58) Field of Classification Search ........... 313/498–512
See application file for complete search history.

(56) References Cited

U.S. PATENT DOCUMENTS

| | | | |
|---|---|---|---|
| 7,486,007 B2 | 2/2009 | Lee | |
| 2004/0201346 A1* | 10/2004 | Pai | 313/503 |
| 2004/0238827 A1* | 12/2004 | Takayama et al. | 257/79 |
| 2005/0140265 A1* | 6/2005 | Hirakata | 313/483 |
| 2005/0258441 A1 | 11/2005 | Shitagami | |
| 2006/0033161 A1* | 2/2006 | Koyama | 257/350 |
| 2006/0145596 A1* | 7/2006 | Coe | 313/500 |
| 2006/0163577 A1* | 7/2006 | Yamazaki et al. | 257/59 |
| 2007/0004202 A1* | 1/2007 | Fujii | 438/678 |
| 2007/0051959 A1* | 3/2007 | Konuma et al. | 257/83 |
| 2007/0091978 A1* | 4/2007 | Tanaka et al. | 372/109 |
| 2007/0228382 A1* | 10/2007 | Yamazaki et al. | 257/72 |
| 2007/0295973 A1* | 12/2007 | Jinbo et al. | 257/88 |
| 2008/0007167 A1* | 1/2008 | Ahn et al. | 313/505 |

FOREIGN PATENT DOCUMENTS

| | | | |
|---|---|---|---|
| JP | 2006-004907 A | | 1/2006 |
| KR | 10-2003-0022470 A | | 3/2003 |
| KR | 10-2004-0051950 A | * | 6/2004 |
| KR | 10-2006-0010354 A | | 2/2006 |
| KR | 10-2006-0055615 A | | 5/2006 |
| KR | 10-2006-0085491 A | | 7/2006 |

* cited by examiner

*Primary Examiner* — Joseph L Williams
*Assistant Examiner* — Kevin Quarterman
(74) *Attorney, Agent, or Firm* — Lee & Morse, P.C.

(57) ABSTRACT

An electroluminescent (EL) display includes a substrate, an EL pixel array with a light emitting diode (LED) on the substrate, a connector electrically coupled to the EL pixel array, an encapsulant on the substrate and surrounding the EL pixel array, an encapsulation substrate attached to the substrate, the EL pixel array enclosed between the encapsulation substrate and the substrate, and a conductive film electrically coupled to the connector, the conductive film being in communication either with the substrate or the encapsulation substrate.

24 Claims, 5 Drawing Sheets

ELECTROLUMINESCENT DISPLAY INCLUDING CONDUCTIVE FILM COUPLED TO CONNECTOR

BACKGROUND OF THE INVENTION

1. Field of the Invention

Embodiments of the present invention relate to an electroluminescent (EL) display. More particularly, embodiments of the present invention relate to an EL display providing an improved protection to its internal components from external electrostatic discharge.

2. Description of the Related Art

Generally, an electroluminescent (EL) display is a flat panel display device employing a light emitting diode (LED) activated by combination of electrons and holes from a cathode and an anode, respectively, in a light emitting layer of the LED. In other words, the LED may include a light emitting layer between the anode and the cathode, so that applied voltage may trigger electron/hole flow from the cathode/anode into the light emitting layer to activate light emission. Such EL displays may be employed in mobile communication terminals, navigation devices, personal display assistances (PDAs), camcorders, and so forth.

A conventional EL display may be driven by a passive matrix (PM) technique or by an active matrix (AM) technique. The PM technique may refer to a driving technique where lines of anodes and cathodes orthogonal to each other may be selected to drive light emission cells. The AM technique may refer to a driving technique where each emission cell may be driven by a thin film transistor (TFT) via received and stored voltage signals. The AM technique may have better luminance and lower power consumption as compared to the PM technique, and thus, may be employed in EL displays having high resolution, wide viewing angles, quick response time, and reduced thickness.

However, a reduced thickness of the conventional EL display, e.g., about 1 mm to about 2 mm, may be insufficient to shield internal elements thereof, e.g., the LED, from external electrostatic impacts. For example, a strong flow of an electrostatic discharge, e.g., voltage of about several thousands of volts or several tens of thousand volts, into the EL display may damage or break internal elements thereof and, thereby, produce a soft fail phenomenon, i.e., temporary flickering of a displayed image, or a hard fail phenomenon, i.e., a complete failure to display images due to permanent damage to a circuit or a pixel in the EL display. Accordingly, there exists a need for an EL display capable of providing sufficient protection to internal elements thereof from external electrostatic impacts.

SUMMARY OF THE INVENTION

The present invention is therefore directed to an electroluminescent (EL) display, which substantially overcomes one or more of the disadvantages of the related art.

It is therefore a feature of an embodiment of the present invention to provide an EL display having a structure capable of shielding internal elements thereof from an external electrostatic discharge.

At least one of the above and other features and advantages of the present invention may be realized by providing an EL display, including a substrate, an EL pixel array with a light emitting diode (LED) on the substrate, a connector electrically coupled to the EL pixel array, an encapsulant on the substrate and surrounding the EL pixel array, an encapsulation substrate attached to the substrate, the EL pixel array enclosed between the encapsulation substrate and the substrate, and a conductive film electrically coupled to the connector and in communication either with the substrate or the encapsulation substrate. The EL display may further include a ground connecting line electrically coupled between a ground line of the connector and the conductive film.

The EL display may also include a conductive adhesive coupled between the ground connecting line and the conductive film. The ground connecting line may overlap with the conductive film. The conductive adhesive may be enclosed between the encapsulation substrate, the encapsulant, and the substrate. The conductive adhesive may include a silver paste, an indium paste, or an indium alloy paste.

The ground connecting line may be directly coupled to the conductive film. The ground connecting line may be on an outer lateral surface of the encapsulant. The connector may be a flexible printed circuit or a chip on flexible (COF). The conductive film may be aligned with outer lateral surfaces of the encapsulant and the encapsulation substrate.

The conductive film may be a transparent metal film disposed across an entire inner surface of the encapsulation substrate. The transparent metal may be one or more of indium-tin-oxide, indium-zinc-oxide, or indium-tin-zinc-oxide.

The conductive film may be a discontinuous opaque metal film corresponding to a pixel defining film of the EL pixel array. The conductive film may have a pattern of horizontal stripes, vertical stripes, or a grid. The stripes of the conductive film may be between lines of LEDs. The opaque metal may include one or more of a chromium, an aluminum, or an alloy of aluminum.

The LED of the EL pixel array may be an organic light emitting diode (OLED). The OLED may include a fluorescent material or a phosphorescent material. The EL display may further include a polycrystalline TFT for driving the LED.

The encapsulation substrate may be transparent. The substrate may be horizontally longer than the encapsulation substrate. The conductive film may be under the substrate. The LED may be a bottom emission type. The substrate may be transparent.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
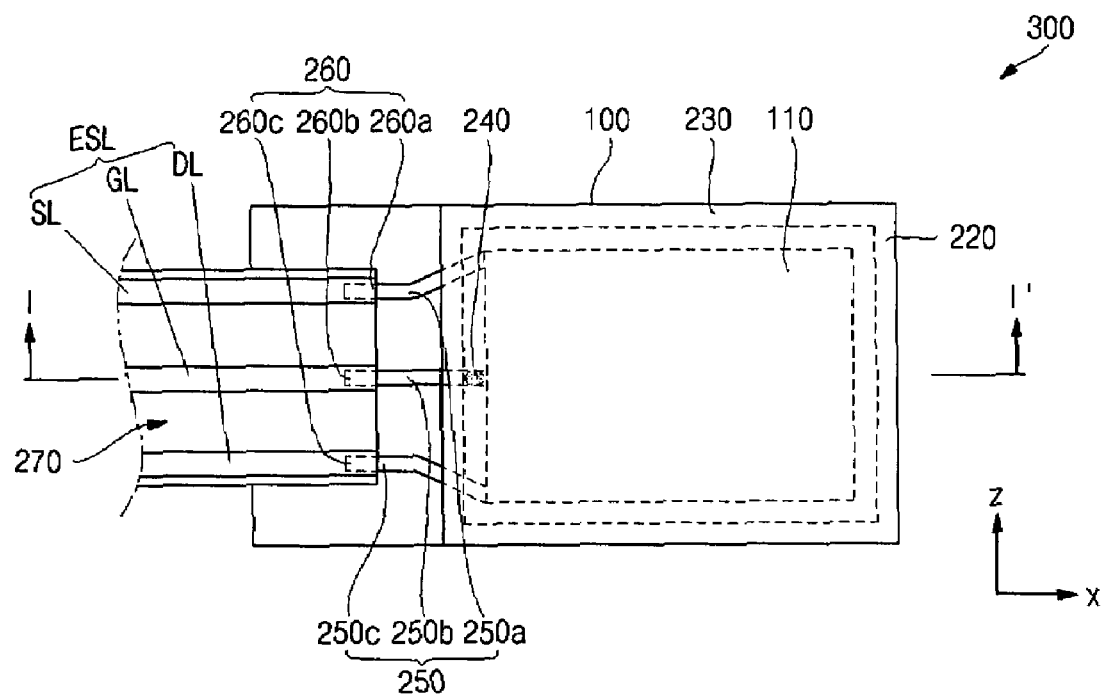
FIG. 1 illustrates a schematic plan view of an electroluminescent (EL) display according to an exemplary embodiment of the present invention.

Korean Patent Application No. 10-2007-0004438 filed on Jan. 15, 2007 in the Korean Intellectual Property Office and entitled: "Organic Electroluminescence Display," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers or elements may also be present. Further, it will be understood that when a layer or element is referred to as being "under" another layer or substrate, it can be directly under, or one or more intervening layers or elements may also be present. In addition, it will also be understood that when a layer or elements is referred to as being "between" two layers or elements, it can be the only layer or element between the two layers or elements, or one or more intervening layers or elements may also be present. It will further be understood that when an element is referred to as being "coupled" to another element, it can be directly coupled to the other element, or one or more intervening elements may also be present. Like reference numerals refer to like elements throughout.

Hereinafter, exemplary embodiments of an electroluminescent (EL) display according to the present invention will be described in more detail below with reference to FIGS. 1-3. It should be noted that FIGS. 1-3 illustrate only one unit pixel of a plurality of unit pixels of a top emission type EL display, i.e., a display emitting light toward a top thereof with respect to the substrate 100.

Figure 2:
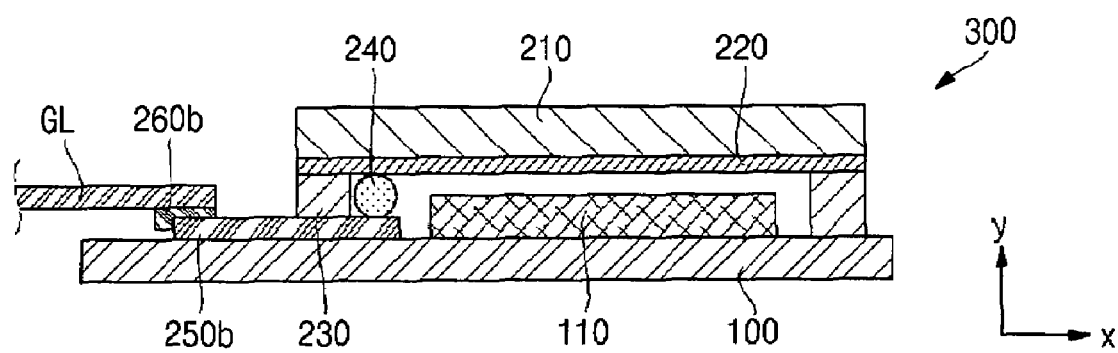
FIG. 2 illustrates a cross sectional view along line I-I' of FIG. 1.
Figure 3:
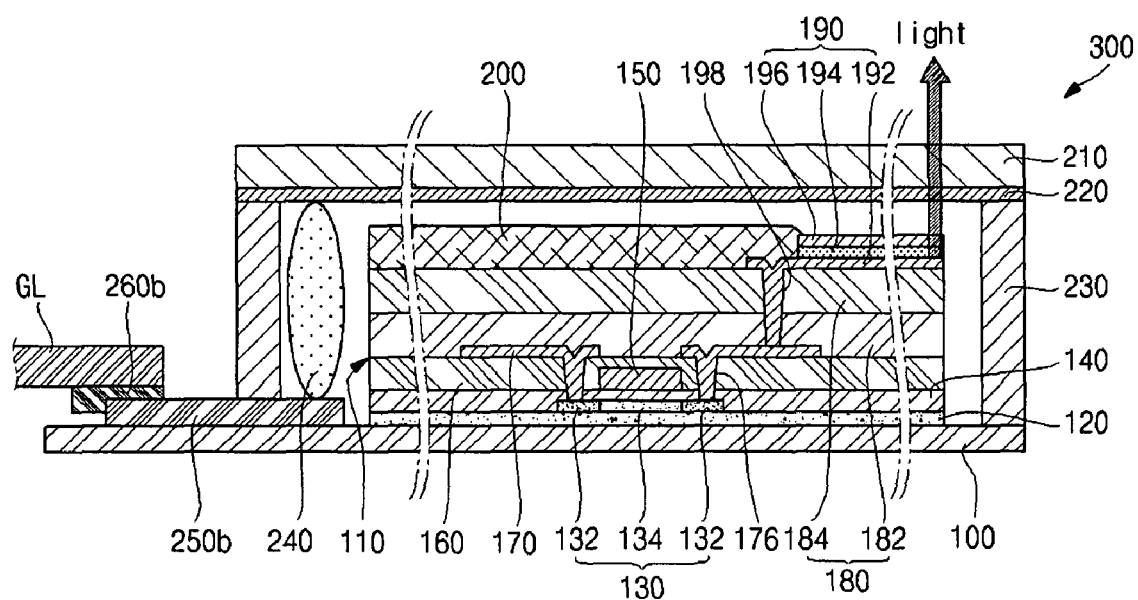
FIG. 3 illustrates a cross-sectional view of an EL pixel array of the EL display illustrated in FIG. 2.

As illustrated in FIGS. 1-3, an EL display 300 according to an exemplary embodiment of the present invention may include a substrate 100, an EL pixel array 110 on the substrate 100, a connector 270 electrically coupled to the EL pixel array 110 via an electrical signal line (ESL), an encapsulant 230 on the substrate 100 and surrounding the EL pixel array 110, an encapsulation substrate 210 coupled with the substrate 100 via the encapsulant 230, and a conductive film 220 in electrical communication with the ESL of the connector 270.

The substrate 100 of the EL display 300 may have substantially flat and parallel upper and lower surfaces, so that a thickness therebetween, i.e., a thickness of the substrate 100, may be about 0.05 mm to about 1 mm. A thickness of the substrate 100 below about 0.05 mm may provide little protection to the substrate 100 from processing damage during manufacturing, e.g., washing, etching, heat treatment, and so forth, or from external physical impact. A thickness of the substrate 100 above about 1 mm may be difficult to incorporate into thin display devices. The substrate 100 may be formed of glass, plastic, polymer, and so forth.

The EL pixel array 110 of the EL display 300 may include a plurality of unit pixels on the substrate 100. Each unit pixel may include a LED, a TFT, and a capacitor. More particularly, as illustrated in FIG. 3, the EL pixel array 110 may include a buffer layer 120, a semiconductor layer 130, a gate insulation film 140, a gate electrode 150, an interlayer insulation film 160, and a source/drain electrode 170 on the substrate 100, so that the EL pixel array 110 may include a thin film transistor (TFT). Additionally, as further illustrated in FIG. 3, the EL pixel array 110 may include an insulation film 180, a LED 190, and a pixel defining film 200 on the source/drain electrode 170.

The buffer layer 120 of the EL pixel array 110 may be formed on the upper surface of the substrate 100 to minimize or to prevent vapor, e.g., $H_2O$, and gas, e.g., $H_2$, $O_2$, and so forth, penetration into the EL pixel array 110. Accordingly, the buffer layer 120 may be formed of silicon oxide ($SiO_x$), silicon nitride ($SiN_x$), or a like material.

The semiconductor layer 130 of the EL pixel array 110 may be formed on an upper surface of the buffer layer 120. Alternatively, the EL pixel array 110 may be formed without the buffer layer 120, so that the semiconductor layer 130 may be formed directly on the substrate 100. The semiconductor layer 130 may include source/drain regions 132 spaced apart from one another and a channel region 134 between the source/drain regions 132, so that the semiconductor layer 130 may be formed as a TFT, e.g., a PMOS-type TFT, a NMOS-type TFT, and so forth, with, e.g., a coplanar structure, an inverted coplanar structure, a staggered structure, an inverted staggered structure, and so forth.

When the semiconductor layer 130 is formed as a TFT, the semiconductor layer 130 may be formed of silicon, e.g., amorphous silicon (a-Si), polysilicon, micro-silicon, and so forth, or of an organic material by way of crystallization. More specifically, the semiconductor layer 130 may be formed by a laser crystallization method (LCM), e.g., an excimer laser annealing crystallization (ELA), a metal induced crystallization (MIC), e.g., a metal induced lateral crystallization (MILC) or a metal induced crystallization with a capping layer (MICC), a solid phase crystallization (SPC), a thermal crystallization method (TCM), a high pressure annealing crystallization (HPAC), and so froth. For example, the semiconductor layer 130 may be formed of micro-silicon to have a grain size larger than a grain size of a-Si but smaller than a grain size of polysilicon, i.e., a grain size of the micro-silicon may be about 1 mm to about 100 mm, to provide electron and hole mobility therein at about 1 $cm^2*V^{-1}*s^{-1}$ to about 50 $cm^2*V^{-1}*s^{-1}$ and about 0.01 $cm^2*V^{-1}*s^{-1}$ to about 0.2 $cm^2*V^{-1}*s^{-1}$, respectively.

When the semiconductor layer 130 is formed of micro-silicon by TCM, a-Si may be reheated to modify a crystallization structure thereof into micro-silicon during deposition. When the semiconductor layer 130 is formed of micro-silicon by HPAC, a-Si may be crystallized at high temperature and humid atmosphere, followed by a sequential lateral solidification (SLS) process using a mask. When the semiconductor layer 130 is formed of micro-silicon by MIC, metal catalysts, e.g., nickel (Ni), cobalt (Co), palladium (Pd), titanium (Ti), and so forth, may be deposited or spin-coated into the a-Si at low temperatures to change a phase of the a-Si and facilitate crystallization thereof. For example, in the MILC, a mask, such as a shadow mask, e.g., a line-type mask or a dot type mask, may be used to deposit a metal layer on the a-Si to minimize contaminants, e.g., nickel silicide, in the TFT. Alternatively, in the MICC, a capping layer, e.g., a silicon nitride ($SiN_x$) film, may be used in addition to a metal catalyst layer on the a-Si in order to facilitate control of a metal amount introduced into the a-Si, i.e., the metal amount may be determined with respect to a thickness of the $SiN_x$ film, via a shadow mask. Once the a-Si is crystallized, the capping layer may be removed by wet or dry etching.

Once the semiconductor layer 130 is formed, a gate insulation film 140, a gate electrode 150, and an interlayer insulation film 160 may be deposited on the semiconductor layer 130, followed by etching of a via hole through the interlayer insulation film 160 and performing a gattering process, i.e., injection of impurities into the base layer through the via hole at low heat temperatures to facilitate removal of a potential remaining amount of metal catalytic impurities from the base layer.

The gate insulation film 140 of the EL pixel array 110 may be formed on the substrate 100, as illustrated in FIG. 3, and in communication with an upper surface of the semiconductor layer 130, e.g., the gate insulation film 140 may be formed on the buffer layer 120 and in communication with the upper surface of the semiconductor layer 130. The gate insulation film 140 may be formed of an oxide film, a nitride film, or a like material.

The gate electrode 150 of the EL pixel array 110 may be formed on an upper surface of the gate insulation film 140, as illustrated in FIG. 3, so that the gate electrode 150 may be formed to overlap with the channel region 134 of the semiconductor layer 130. The gate electrode 150 may provide an electric field to the channel region 134 of the semiconductor layer 130 to facilitate formation of a hole/electron channel in the channel region 134. The gate electrode 150 may be formed of metal, e.g., molybdenum tungsten (MoW), titanium (Ti), copper (Cu), aluminum-neodymium (AlNd), aluminum (Al), chromium (Cr), or an alloy thereof, doped polysilicon, and like materials.

The interlayer insulation film 160 of the EL pixel array 110 may be formed on an upper surface of the gate electrode 150 and in communication with the gate insulation film 140, as illustrated in FIG. 3. The interlayer insulation film 160 may be formed of a polymer-based material, a plastic-based material, a glass-based material or a like material.

The source/drain electrode 170 of the EL pixel array 110 may be formed on an upper surface of the interlayer insulation film 160, as illustrated in FIG. 3. The source/drain electrode 170 may be in electrical communication with the semiconductor layer 130 via a conductive contact 176 passing through the interlayer insulation layer 160. The source/drain electrode 170 may be formed of a same metal material as the gate electrode 150.

The insulation film 180 of the EL pixel array 110 may be formed on an upper surface of the source/drain electrode 170, and may include a protective film 182 and a planarization film 184, as illustrated in FIG. 3. The protective film 182 may be formed by depositing an inorganic material on the source/drain electrode 170 and on the interlayer insulation layer 160 in order to shield the source/drain electrodes 170 and the gate electrode 150. The planarization film 184 may be formed by depositing, e.g., benzo-cyclo-butane (BCB), an acrylic-based compound, and so forth, on the protective film 182 to planarize a surface of each element.

The LED 190 of the EL pixel array 110 may be formed on an upper surface of the insulation film 180, i.e., an upper surface of the planarization film 184. The LED 190 may include an anode 192, a luminescent film 94 on the anode 192, and a cathode 196 on the luminescent film 194, as illustrated in FIG. 3. The anode 192 and the source/drain electrode 170 may be electrically coupled through an electrically conductive via 198 formed through the insulation film 180. The LED 190 may be an organic light emitting diode (OLED).

The anode 192 of the LED 190 may be made of metal having a low work function, e.g., indium-tin-oxide (ITO), indium-tin-oxide/silver (ITO/Ag), ITO/Ag/ITO, indium zinc oxide (IZO), ITO/Ag/IZO, and so forth. The ITO may provide a transparent conductive film having a sufficiently small barrier for injecting holes into the luminescent film 194. The Ag may facilitate reflection of light from the luminescent film 194 toward an upper portion of the LED 190, in an upward direction with respect to the anode 192.

The luminescent film 194 of the LED 190 may be formed of a photoluminescent, e.g., fluorescent or phosphorescent, material, and may include an emission layer (EML) capable of emitting light upon combination of electrons and holes therein, an electron transport layer (ETL) capable of controlling electron mobility, a hole transport layer (HTL) capable of controlling hole mobility, an electron injecting layer (EIL) capable of enhancing electron injection efficiency, and a hole injecting layer (HIL) capable of enhancing hole injection efficiency. If a phosphorescent material is employed in the luminescent film 194, a hole blocking layer (HBL) may be selectively formed between the EML and the ETL, and an electron blocking layer (EBL) may be selectively formed between the EML and the HTL. Further, the layers of the luminescent film 194 may be combined to reduce thickness of the LED 190, thereby improving luminance efficiency. For example, the HIL and HTL may be combined into a single hole injection transport layer (HITL). Similarly, the EIL and the ETL maybe combined into a single electron injection transport layer (EITL).

The photoluminescent material employed in the luminescent film 194 may include a doped organic material. The fluorescent organic material may include, e.g., tris-(8-hydroxyquinoline)aluminum (Alq$_3$); bis-(10-hydroxyben-zo[h]quinolinato)beryllium (BeBq$_2$); 4-methyl-8-hydroxyquinoline (Almq); aluminum(III)bis(2-methyl-8-hydroxyquinolinato)4-phenylphenolate (BAlq); ((Bis[2-(2-benzoxazolyl)phenolato]Zinc(II)) (ZnPBO); ZnPBT; azomethine-metal complexes; distyrylbenzene derivative; and so forth. The doping material of the fluorescent organic material may be a coumarin derivative; 4-(dicyanomethylene)-2-methyl-6-(dimethylaminostyryl)-4H-pyran (DCM); quinacridone; lublen; and so forth. The phosphorescent organic material may include bis(2-(2'-benzo[4,5-a]thienyl)pyridinato-N,C)iridium(acetylacetonate) (Btp2Ir(acac)); tris-(2-phenylpyridine)iridium (Ir(PPy)$_3$); and bis[(4,6-difluorophenyl)-pyridinato-N,C2](picolinate)iridium (III) (FIrpic).

The cathode 196 of the LED 190 may be formed of aluminum (Al), magnesium silver alloy (MgAg), magnesium calcium alloy (MgCa), and so forth. In this respect, it should be noted that when a top emitting type EL display is formed, a thickness of Al may be low to minimize a high resistance, i.e., high electron injecting barrier. Further, even though MgAg may have a lower electron injecting barrier than Al, and MgCa may have a lower electron injecting barrier than MgAg, MgAg and MgCa may have to be intercepted from an exterior of the EL pixel matrix 110 to prevent formation of an oxidized insulation layer thereon due to high sensitivity to its surrounding.

The LED 190 of the EL pixel array 110 according to an embodiment of the present invention may further include a buffer layer (not shown). The buffer layer may be divided into an electron buffer layer (EBL) for buffering electrons and a hole buffer layer (HBL) for buffering holes. The EBL may be selectively formed between the cathode 196 and the ETL, i.e., the EBL may be between the cathode 196 and the EIL or between the ETL and the ETL. The HBL may be selectively formed between the anode 192 and the HTL, i.e., the HBL may be between the anode 192 and the HIL or between the HIL and the HTL.

When the LED 190 has a normal slim structure, i.e., anode/HITL/EML/ETL/EIL/cathode, the buffer layer positional configurations may include, e.g., anode/HBL/HITL/EML/ETL/EIL/cathode; anode/HIL/HTL/EML/EITL/EBL/cathode; anode/HBL/HTL/EML/EITL/EBL/cathode; anode/HITL/HBL/EML/ETL/EIL/cathode; and anode/HIL/HTL/EML/EBL/EITL/cathode. Similarly, when the LED 190 has an inverted stack structure, i.e., cathode/EIL/ETL/EML/HTL/HIL/anode, the buffer layer configurations may include, e.g., cathode/EIL/ETL/EML/HTL/HIL/HBL/anode; cathode/EBL/EIL/ETL/EML/HTL/HIL/anode; cathode/EBL/EIL/ETL/EML/HTL/HBL/anode; cathode/EIL/ETL/EML/HTL/HBL/HIL/anode; and cathode/EIL/EBL/ETL/EML/HTL/EIL/anode. Further, when the LED 190 has an inverted slim structure, i.e., cathode/EIL/ETL/EML/HITL/anode, the buffer layer configurations may include, e.g., cathode/EIL/ETL/EML/HIL/HBL/anode; cathode/EBL/EITL/EML/HTL/HIL/anode; cathode/EBL/EIL/EML/HTL/HBL/anode; cathode/EIL/ETL/EML/HBL/HITL/anode; and cathode/EITL/EBL/EML/HTL EIL/anode.

The pixel defining film 200 of the EL pixel array 110 may be formed on an upper surface of the insulation film 180 and in communication with the LED 190, as illustrated in FIG. 3. The pixel defining film 200 may not block light emitted from the LED 190, and may provide a boundary between fields of red, green and blue light emitted from the LED 190. The pixel defining film 200 may be formed of, e.g., polyimide.

The encapsulant 230 of the EL display 300 may be formed on the substrate 100 to surround the EL pixel array 110, as illustrated in FIGS. 1-2. More specifically, the encapsulant 230 may form a continuous structure around the EL pixel array 110, and may protrude upward from the substrate 100 to a height higher than a height of the EL pixel array 110 with respect to a direction perpendicular to the substrate 100, i.e., along the y-axis. The encapsulant 230 may be formed of an adhesive material, e.g., an epoxy adhesive, a ultraviolet (UV) cured adhesive, a frit, and so forth, to facilitate adhesion between the encapsulation substrate 210 and the substrate 100, as will be discussed in more detail below. If frit is used to from the encapsulant 230, the frit may be heated to exceed a predetermined temperature, so that attachment of the encapsulation substrate 210 and the substrate 100 via the encapsulant 230 may be performed by a laser beam, i.e., the frit may exhibit improved adhesion properties due to a molten state thereof.

The encapsulation substrate 210 of the EL display 300 may be adhered to the substrate 100 via the encapsulant 230, so that the EL pixel array 110 may be enclosed, i.e., sealed from an exterior of the EL display 300, between the encapsulation substrate 210 and the substrate 100, as illustrated in FIG. 2. The encapsulation substrate 210 may be formed of a transparent material, e.g., glass, plastic, polymer, and so forth, so that light generated by the LED 190 may be transmitted through the encapsulation substrate 210. The encapsulation substrate 210 may be horizontally shorter than the substrate 100, i.e., as determined with respect to the x-axis, as illustrated in FIGS. 2-3.

The connector 270 of the EL display 300 may include a scan line SL, a data line DL and a ground line GL, as illustrated in FIG. 1. Each of the SL, DL and GL of the connector 270 may electrically couple the EL pixel array 110 to an external circuit module, e.g., a printed circuit board (PCB), via a respective connecting line 250 and a respective pad part 260. In detail, the connecting lines 250 may include a scan connecting line 250a, a ground connecting line 250b, and a data connecting line 250c. Similarly, the pad parts 260 may include a scan pad part 260a, a ground pad part 260b and a data pad part 260c. Accordingly, each of the SL, DL and GL of the connector 270 may be connected via a corresponding connecting line 250 and a pad part 260 to the EL pixel array 110. For example, the SL of the connector 270 may be connected via the scan pad part 260 and via the scan connecting line 250a to the EL pixel array 110. The connector 270 may be a flexible printed circuit or a chip on flex (COF).

The connecting lines 250 may be positioned on the substrate 100, and may overlap with the encapsulation substrate 230 and the conductive film 220. In other words, a portion of the connecting lines 250 may be inside an interior space enclosed by the substrate 100, encapsulation substrate 210 and the encapsulant 230, as illustrated in FIG. 2. The connecting lines 250 may be parallel to the substrate 100, and may connect the EL pixel array 110 to the connector 270 via the pad parts 260.

The conductive film 220 of the EL display 300 may be formed in communication with an inner surface of the encapsulation substrate 210, as illustrated in FIG. 2. More specifically, the conductive film 220 may be formed between the encapsulation substrate 210 and the EL pixel array 110 to induce any electrostatic discharge flowing through the encapsulation substrate 210 toward the GL of the connector 270 via the connecting lines 250. It should be noted that an "inner surface" refers to a surface of an element that is facing an interior of a space formed to enclose the EL pixel array 110, i.e., an interior space formed between the substrate 100, the encapsulation substrate 210, and the encapsulant 230. Similarly, an "outer surface" refers to a surface of an element that is facing away from the space formed to enclose the EL pixel array 110.

The conductive film 220 may be positioned above the EL pixel array 110 and in communication with the encapsulant 230, so that the conductive film 220 may be aligned with outer lateral surfaces of the encapsulant 230 and the encapsulation substrate 210. In other words, outer edges of the conductive film 220 may extend to be in communication with an exterior, i.e., a space outside the enclosed space of the EL pixel array 110, as illustrated in FIGS. 2-3. However, other configurations of the conductive film 220, e.g., the conductive film 220 may be sealed inside the space enclosing the EL pixel array 110 without contact with the exterior, are within the scope of the present invention. The conductive film 220 may be formed of a transparent conductive metal, e.g., ITO, IZO, indium-tin-zinc-oxide, and so forth. The conductive film may be applied across an entire inner surface of the encapsulation substrate 210, i.e., a surface facing the substrate 100, by a sputtering deposition method to provide a surface capable of transmitting light emitted from the EL pixel array 110 toward the encapsulation substrate 210.

The conductive film 220 may be coupled to the connecting lines 250 via a conductive adhesive 240 disposed on a portion of the connecting lines 250, i.e., the ground connecting line 250b, located in the interior space enclosing the EL pixel array 100. More specifically, the conductive adhesive 240 may be positioned between the encapsulant 230 and the EL pixel array 110 with respect to the x-axis, as illustrated in FIG. 2, so that the conductive adhesive may be inside the interior space enclosing the EL pixel array 100. However, other conductive adhesive 240 configurations with respect to the conductive film 220, i.e., between the conductive film 220 and the connecting line 250 outside the interior space enclosing the EL pixel array 110, are within the scope of the present invention.

The conductive adhesive 240 may be applied via, e.g., heat, and may electrically couple the conductive film 220 with the GL of the connector 270 through the ground connecting line 250*b* and the ground pad part 260*b*. Accordingly, the conductive film 220 may be electrically coupled with the GL of the connector 270 through the conductive adhesive 240, the ground connecting line 250*b*, and the ground pad part 260*b*. The conductive adhesive 240 may be formed of an anisotropic conductive film or a metal paste, e.g., Ag, In, alloys thereof, and so forth.

Without intending to be bound by theory, it is believed that when electrostatic discharge flows into the EL display 300 from the exterior through the encapsulation substrate 210, the conductive film 220 may induce the flow of electrostatic discharge to the GL of the connector 270 through the conductive adhesive 240, the ground connecting line 250*b* and the ground pad part 260*b*. In other words, strong electrostatic discharge, e.g., thousands of volts to tens of thousands of volts, may be diverted by the conductive film 220 toward the ground, thereby shielding, among other elements, the EL pixel array 110 from excessive electrostatic discharge impact.

Figure 4:
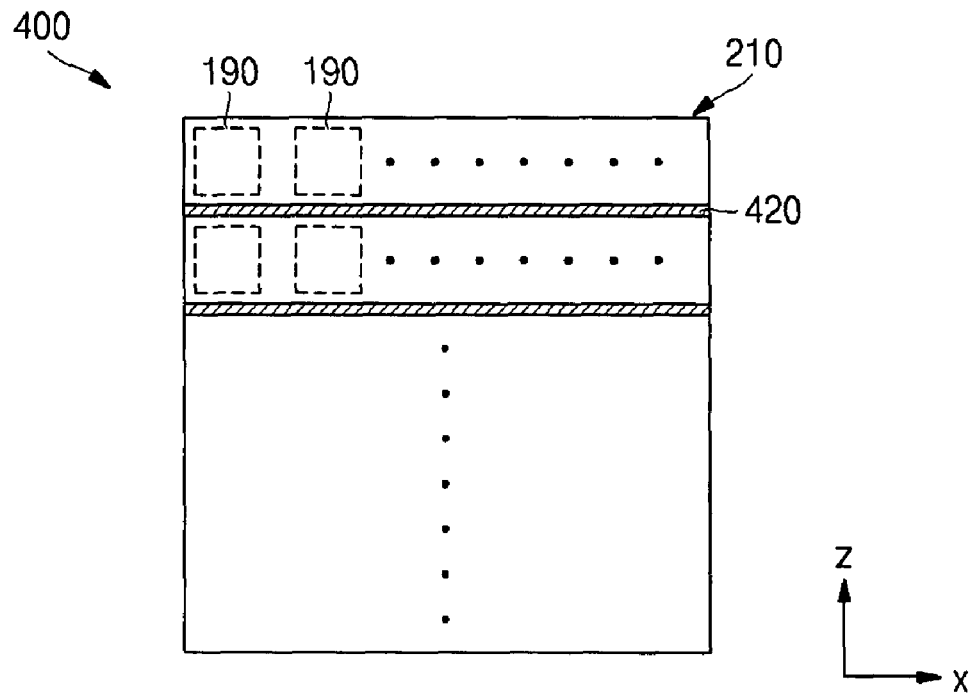
FIG. 4 illustrates a plan view of a pattern of a conductive film of an EL display according to an exemplary embodiment of the present invention.

According to other embodiments of the present invention, an EL display device may include a conductive film formed of an opaque metal at a predetermined pattern corresponding to a pixel defining film of a LED. More particularly, as illustrated in FIG. 4, an EL display 400 may be similar to the EL display 300 described previously with respect to FIGS. 1-3, with the exception of including a conductive film 420 positioned between rows of LEDs 190. In this respect, it should be noted that elements of the EL display 400 other than the conductive film 420 may be similar to the elements of the EL display 300 described previously with respect to FIGS. 1-3, and therefore, their detailed description will not be repeated herein.

The conductive film 420 of the EL display 400 may be a discontinuous film formed on the inner surface of the encapsulation substrate 210 of an opaque metal, e.g., chromium (Cr), aluminum alloy, and so forth. In this respect, it should be noted that a "discontinuous film" refers to a film having a plurality of discrete segments that may or may not be connected at least at one point, so that the plurality of segments may be arranged to form at least one opening in the film to expose a surface below or above the film. More specifically, the conductive film 420 may be formed to have a predetermined pattern corresponding to the pixel defining film 200 illustrated in FIG. 3. In other words, the predetermined pattern of the conductive film 420 may overlap with portions of the pixel defining film 200, so that light emitted from the LED 190 of the EL pixel array 110 may not be blocked by the conductive film 420, i.e., the light may be capable of being transmitted through the encapsulation substrate 210.

For example, as illustrated in FIG. 4, the conductive film 420 may include a plurality of segments arranged as horizontal, i.e., along the x-axis, parallel stripes. Each stripe may be positioned between lines, e.g., rows, of LEDs 190 to correspond to the pixel defining film 200. For example, as further illustrated in FIG. 4, each stripe may be positioned between two lines of LEDs 190. A length of at least one stripe of the conductive film 420 along the horizontal direction may be sufficient to provide contact between the stripe and the conductive adhesive 240.

Figure 5:
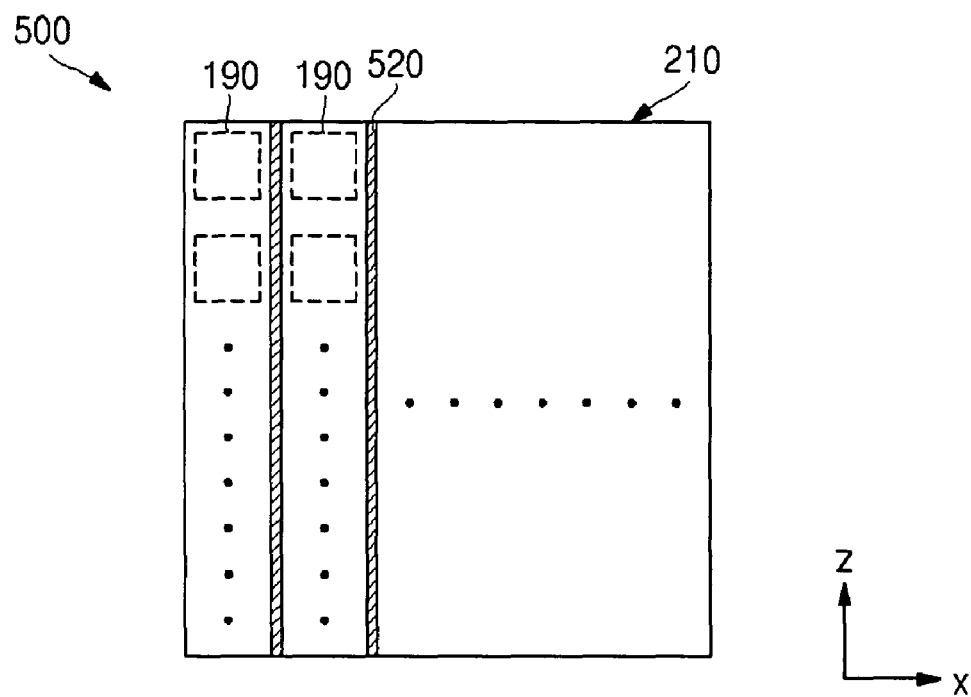
FIG. 5 illustrates a plan view of a pattern of a conductive film of an EL display according to another exemplary embodiment of the present invention.

According to yet another embodiment of the present invention illustrated in FIG. 5, an EL display 500 may be similar to the EL display 400 described previously with respect to FIG. 4, with the exception of having a conductive film 520 positioned between lines, e.g., columns, of LEDs 190. In this respect, it should be noted that elements of the EL display 500 other than the conductive film 520 may be similar to the elements of the EL display 300 described previously with respect to FIGS. 1-3, and therefore, their detailed description will not be repeated herein.

The conductive film 520 of the EL display 500 may be similar to the conductive film 420 with the exception of a pattern thereof. As illustrated in FIG. 5, the conductive film 520 may include a plurality of discontinuous segments arranged as vertical, i.e., along the z-axis, parallel stripes, each stripe positioned between two columns of LEDs 190 to correspond to the pixel defining film 200. A length of at least one stripe of the conductive film 520 along the vertical direction may be sufficient to provide contact between the stripe and the conductive adhesive 240.

Figure 6:
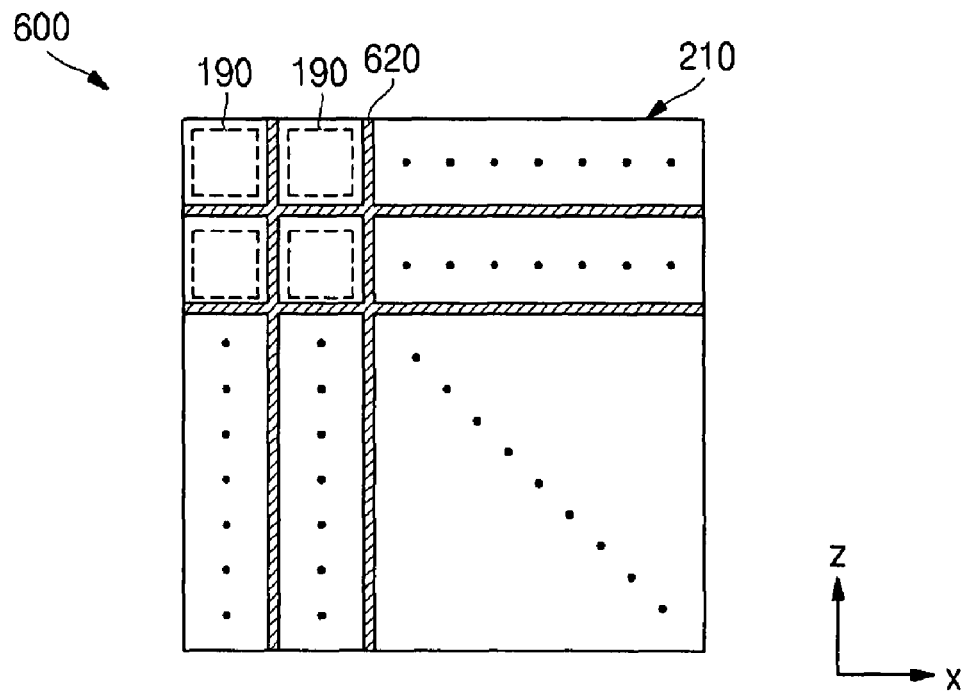
FIG. 6 illustrates a plan view of a pattern of a conductive film of an EL display according to another exemplary embodiment of the present invention.

According to still another embodiment of the present invention illustrated in FIG. 6, an EL display 600 may be similar to the EL display 400 described previously with respect to FIG. 4, with the exception of having a grid-patterned conductive film 620. In this respect, it should be noted that elements of the EL display 600 other than the conductive film 620 may be similar to the elements of the EL display 300 described previously with respect to FIGS. 1-3, and therefore, their detailed description will not be repeated herein.

The conductive film 620 of the EL display 600 may be similar to the conductive film 420 with the exception of a pattern thereof. As illustrated in FIG. 6, the conductive film 620 may have a grid pattern with a plurality of intersecting vertical and horizontal segments, so that each LED 190 may be surrounded by the conductive film 620, i.e., the configuration of the conductive film 620 may form a frame structure around each LED 190. A length of at least one vertical and/or horizontal segment of the grid pattern may be sufficient to provide contact between the stripe and the conductive adhesive 240.

Similarly to the EL display 300 described previously with respect to FIGS. 1-3, the conductive films 420, 520 and 620 of the EL displays 400, 500 and 600, respectively, may divert excessive electrostatic discharge away from the EL pixel array 110 through the GL of the connector 270, so that the EL pixel array 110 and other circuit elements may be shielded from excessive external electrostatic discharge impact. Additionally, the conductive films 420, 520 and 620 may function as a black matrix, i.e., an element capable of high color absorbency. In other words, formation of the conductive films 420, 520 and 620 of an opaque material between rows and/or columns of pixels may facilitate light interception and separation between pixels to provide high definition and improved color saturation. In particular, the conductive film 620 may exhibit a higher color absorbency efficiency as compared to the conductive films 420 and 520 due to its pattern, i.e., a pattern surrounding each LED 190 individually.

Figure 7:
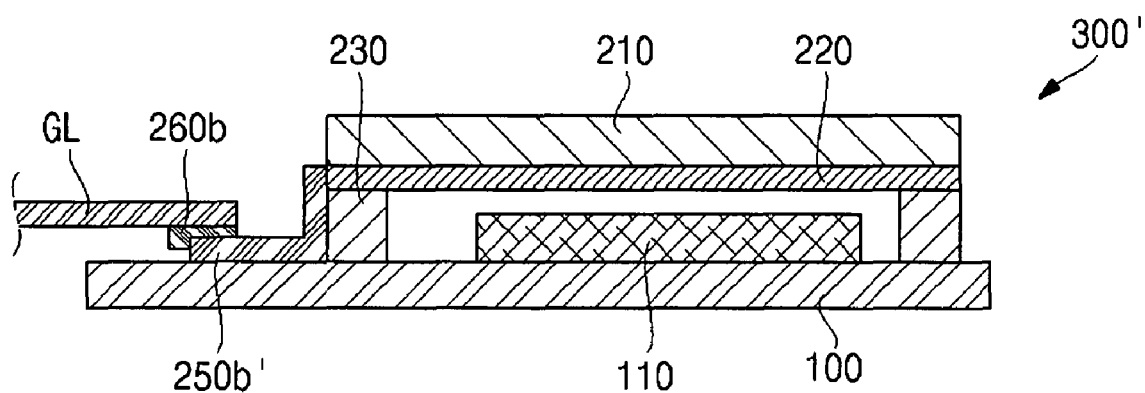
FIG. 7 illustrates a cross sectional view of an EL display according to another embodiment of the present invention.

According to another embodiment of the present invention illustrated in FIG. 7, an EL display 300' may be similar to the EL display 300 described previously with respect to FIGS. 1-3, with the exception of having a direct electrical connection between the conductive film 220 and a ground connecting line 250*b'*, i.e., eliminating use of the conductive adhesive 240. In this respect, it should be noted that elements of the EL display 300' other than the ground connecting line 250*b'* may be similar to the elements of the EL display 300 described previously with respect to FIGS. 1-3, and therefore, their detailed description will not be repeated herein.

The ground connecting line 250*b'* may be configured to extend between the GL of the connector 270 and a lateral outer surface of the conductive film 220, e.g., the ground connecting line 250*b'* may be disposed to be in communication with the upper surface of the substrate 100 and a lateral side of the encapsulant 230 to form a turned L-shape, as illustrated in FIG. 7. Accordingly, the conductive film 220 may be electrically coupled to the GL of the connector 270 through the ground connecting line 250b' and the ground pad part 260b. Without intending to be bound by theory, it is believed that direct electrical connection between the ground connecting line 250b' and the conductive film 220, i.e., removal of the conductive adhesive 240, may minimize resistance generated by the conductive adhesive 240, thereby providing increased efficiency inducing electrostatic discharge to the GL of the connector 270 as compared with the EL display 300.

Figure 8:
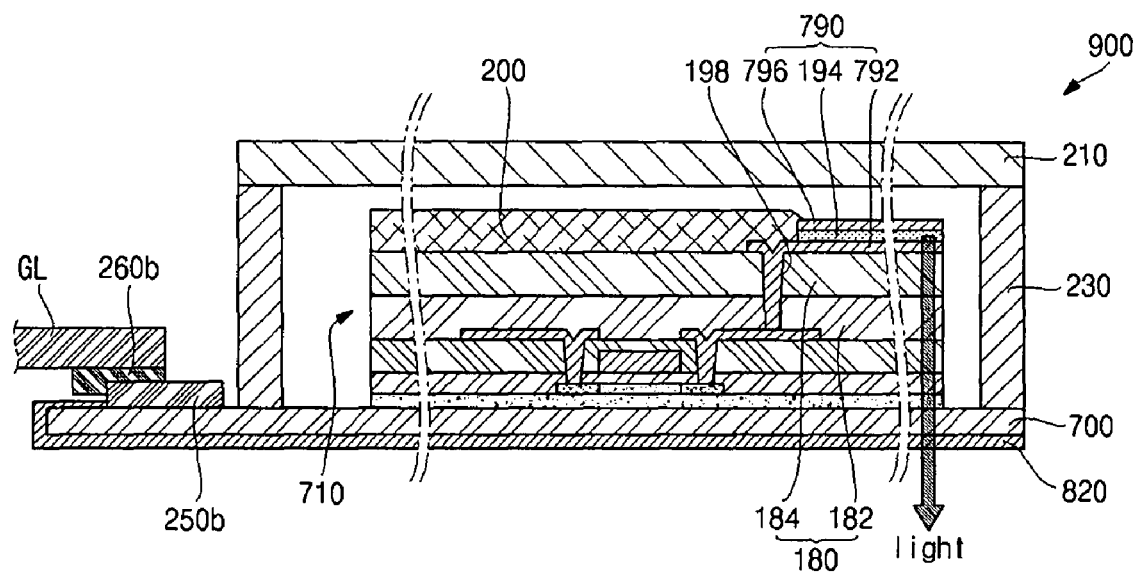
FIG. 8 illustrates a cross sectional view of an EL pixel array of an EL display according to another embodiment of the present invention.

According to yet another embodiment of the present invention illustrated in FIG. 8, an EL display 900 may be similar to the EL display 300 described previously with respect to FIGS. 1-3, with the exception of having a bottom emitting type display with a conductive film 820 under a substrate 700. Similar to the EL display 300, for example, the EL display 900 includes EL pixel array 710. It should be noted that most elements of the EL display 900 may be similar to the elements of the EL display 300 described previously with respect to FIGS. 1-3, and therefore, only elements that are different from the EL display 300 will be described below.

The LED 790 of the EL display 900 according to an embodiment of the present invention may include an anode 792, the luminescent film 194, and a cathode 796 sequentially formed on the upper surface of the insulation film 180. The anode 792 may be formed of a transparent material to facilitate light transmittance therethrough, e.g., ITO, IZO, ITZO, and so forth, and it may be formed in an area that is not above other circuit components to minimize light absorbency in opaque circuit elements. The cathode 796 may be formed of a reflective metal, e.g., Al, MgAg alloy, MgCa alloy, and so forth, to reflect emitted light in a downward direction with respect to the cathode 796.

The conductive film 820 of the EL display 900 according to an embodiment of the present invention may be formed under the substrate 700. More specifically, the conductive film 820 may be deposited on outer lower and lateral surfaces of the substrate 700 and on a portion of an upper surface of the substrate 700 to facilitate electrical connection thereof to the GL of the connector 270 via the ground connecting line 250b and ground pad part 260b. In this respect, it should be noted that the conductive film 820 may not be in communication either with the encapsulant 230 or with the interior sealed space between the substrate 700 and the encapsulation substrate 210. Herein, the substrate 700 may be formed of a transparent material, e.g., glass, plastic, polymer, and so forth, so that light generated by the LED 790 may be transmitted through the substrate 700.

The conductive film 820 may be formed of a transparent metal on an entire outer surface of the substrate 700 to facilitate light transmittance therethrough. Alternatively, the conductive film 820 may be formed of an opaque metal, and may be patterned to correspond to the pixel defining film 200 as discussed previously with respect to conductive films 420, 520 and 620 illustrated in FIGS. 4-6. Without intending to be bound by theory, it is believed that when electrostatic discharge flows into the EL display 900 from the exterior through the substrate 700, the conductive film 820 may induce the flow of electrostatic discharge to the GL of the connector 270 through the ground connecting line 250b and the ground pad part 260b, thereby shielding, among other elements, the EL pixel array 110 from excessive electrostatic discharge impact. The conductive film 820 may also function as a black matrix as previously discussed with respect to conductive films 420, 520 and 620.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An electroluminescent (EL) display, comprising:
a substrate;
an EL pixel array with a light emitting diode (LED) on the substrate;
a connector electrically coupled to the EL pixel array;
an encapsulant on the substrate, the encapsulant surrounding the EL pixel array;
an encapsulation substrate opposing the substrate and disposed on the encapsulant, the EL pixel array being enclosed between the encapsulation substrate and the substrate;
a conductive film electrically coupled to the connector, the conductive film being in communication with the encapsulation substrate, and the conductive film being disposed between the encapsulation substrate and the EL pixel array; and
a ground connecting line electrically coupled between a ground line of the connector and the conductive film.

2. The EL display as claimed in claim 1, further comprising a conductive adhesive coupled between the ground connecting line and the conductive film.

3. The EL display as claimed in claim 2, wherein the ground connecting line overlaps with the conductive film, and the conductive adhesive is parallel to the encapsulant.

4. The EL display as claimed in claim 2, wherein the conductive adhesive is enclosed between the encapsulation substrate, the encapsulant, and the substrate, and the conductive adhesive is directly coupled to the ground connecting line and the conductive film.

5. The EL display as claimed in claim 2, wherein the conductive adhesive includes one or more of a silver paste, an indium paste, and an indium alloy paste.

6. The EL display as claimed in claim 1, wherein the ground connecting line is directly coupled to the conductive film.

7. The EL display as claimed in claim 6, wherein the ground connecting line is on an outer lateral surface of the encapsulant.

8. The EL display as claimed in claim 1, wherein the conductive film is aligned with outer lateral surfaces of the encapsulant and the encapsulation substrate.

9. The EL display as claimed in claim 1, wherein the conductive film includes a transparent metal.

10. The EL display as claimed in claim 9, wherein the conductive film is disposed across an entire inner surface of the encapsulation substrate.

11. The EL display as claimed in claim 9, wherein the transparent metal includes one or more of indium-tin-oxide, indium-zinc-oxide, and indium-tin-zinc-oxide.

12. The EL display as claimed in claim 2, wherein the conductive film includes a discontinuous opaque metal film corresponding to a pixel defining film of the EL pixel array.

13. The EL display as claimed in claim 12, wherein the conductive film has a pattern of horizontal stripes, vertical stripes, or a grid.

14. The EL display as claimed in claim 13, wherein stripes of the conductive film are between two lines of LEDs.

15. The EL display as claimed in claim 14, wherein the opaque metal includes one or more of a chromium, an aluminum, or an alloy of aluminum.

16. The EL display as claimed in claim 1, wherein the connector is a flexible printed circuit or a chip on flex (COF).

17. The EL display as claimed in claim 1, wherein the LED of the EL pixel array is an organic light emitting diode (OLED).

18. The EL display as claimed in claim 17, wherein the OLED includes one or more of a fluorescent material or a phosphorescent material.

19. The EL display as claimed in claim 1, further comprising a polycrystalline TFT for driving the LED.

20. The EL display as claimed in claim 1, wherein the encapsulation substrate is transparent.

21. The EL display as claimed in claim 1, wherein the substrate is horizontally longer than the encapsulation substrate.

22. An electroluminescent (EL) display, comprising:
a substrate;
an EL pixel array with a light emitting diode (LED) on the substrate;
a connector electrically coupled to the EL pixel array;
an encapsulant on the substrate, the encapsulant surrounding the EL pixel array;
an encapsulation substrate attached to the substrate, the EL pixel array enclosed between the encapsulation substrate and the substrate;
a conductive film electrically coupled to the connector, the conductive film being in communication either with the substrate or the encapsulation substrate, and the conductive film being under the substrate; and
a ground connecting line electrically coupled between a ground line of the connector and the conductive film.

23. The EL display as claimed in claim 22, wherein the LED is a bottom emission type.

24. The EL display as claimed in claim 22, wherein the substrate is transparent.

* * * * *